United States Patent [19]
Kuo

[11] Patent Number: 5,854,137
[45] Date of Patent: Dec. 29, 1998

[54] METHOD FOR REDUCTION OF POLYCIDE RESIDUES

[75] Inventor: So Wein Kuo, Hsin-chu, Taiwan

[73] Assignee: Taiwan Semiconductor Manufacturing Company, Ltd., Hsin-chu, Taiwan

[21] Appl. No.: 638,666

[22] Filed: Apr. 29, 1996

[51] Int. Cl.$^6$ ................................................ H01L 21/3065
[52] U.S. Cl. .......................... 438/714; 438/710; 438/712; 438/719; 438/721; 438/732
[58] Field of Search .................... 216/79, 72, 67, 216/70; 438/721, 719, 714, 710, 712, 732

[56] References Cited

U.S. PATENT DOCUMENTS

| | | | |
|---|---|---|---|
| 5,188,980 | 2/1993 | Lai | 437/193 |
| 5,259,923 | 11/1993 | Hori et al. | 156/643 |
| 5,507,874 | 4/1996 | Su et al. | 134/1 |

OTHER PUBLICATIONS

S.M.Sze, VLSI Technology, McGraw Hill Book Co. Singapore, 1988, pp. 221–222.

*Primary Examiner*—Marion McaCamish
*Assistant Examiner*—Cheryl Juska
*Attorney, Agent, or Firm*—George O. Saile; Stephen B. Ackerman

[57] ABSTRACT

An improved method of plasma-activated reactive subtractive etching of polycide layers by mixtures of sulfur hexafluoride, hydrogen bromide, and oxygen gases is achieved. After the subtractive etching of the polycide layer is performed, a purging operation of the reaction chamber by admission of a non-reactive gas such as nitrogen followed by evacuation results in the removal of water vapor and other residual species. This purging step inhibits the formation of needle-like crystals of residual compounds thought to form by chemical reaction between hydrogen bromide and water vapor and other species. Such needle-like crystalline residues can be construed as defects in the etched polycide patterns, and their minimization results in increased manufacturing yields after visual inspection. Additionally, the reduced incidence of residual crystalline residues is beneficial in helping to improve subsequent integrated circuit reliability.

18 Claims, 2 Drawing Sheets

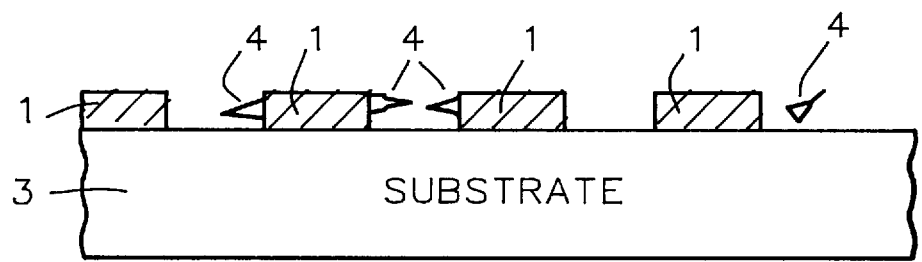
FIG. 1
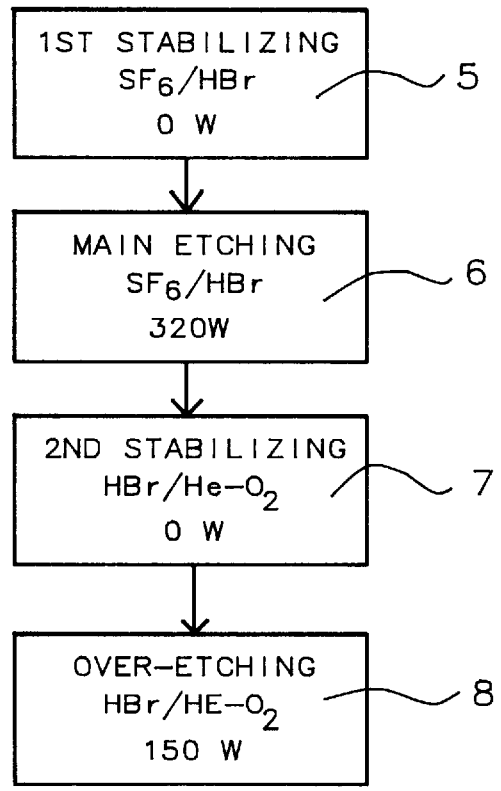
FIG. 2 - Prior Art

METHOD FOR REDUCTION OF POLYCIDE RESIDUES

BACKGROUND OF THE INVENTION

(1) Field of the Invention

The invention relates to a method of etching of metal silicide layers in the fabrication of integrated circuits and more particularly to a method of etching which results in less residual material in the etched patterns, thus producing higher yields and better reliability.

(2) Description of the Prior Art

The use of metal silicide layers deposited on polycrystalline silicon layers, collectively referred to as polycide, is a well-established practice in the manufacture of semiconductor integrated circuits. The electronic stability of the interface between polycide layers and silicon oxide layer makes the polycide layers particularly suitable for use as gate electrodes in metal-oxide-silicon (MOS) integrated circuits widely employed in electronic systems. The polycide layers are commonly formed into the desired gate electrode and other conductive patterns by selective subtractive etching through a photolithographic mask pattern. For this purpose, halogen-containing gases or vapors are employed which are made chemically reactive by the formation therein of an electrical plasma sustained by radiofrequency (RF) energy. Various gases and vapors as well as various types of RF energy input for this purpose are discussed in "VLSI Technology" by S. M. Sze, 2nd Ed., McGraw-Hill Book Co. Singapore, 1988, p. 221–222. A common method employs sulfur hexafluoride as a source gas and hydrogen bromide as an additive gas combined to provide the active halogen atoms in the reactive plasma which react with the silicon and other constituent atoms of the polycide layer to form the volatile chemical halogen compounds which bring about the selective subtractive etching of the layer, and hence form the desired circuit pattern. Refinements to the polycide etching process may be obtained by adding steps using other gas mixtures as, for example, hydrogen bromide and oxygen in helium as a carrier gas.

It has been observed that the sulfur hexafluoride-hydrogen bromide method of polycide etching, although efficaceous in other respects, often is accompanied by the formation of residual material on the completed etched pattern. These residues in the form of needle-like crystals are thought to be solid condensates from the chemical reaction between hydrogen bromide and other species present during or after subtractive etching, and in particular water vapor is thought to be a primary participant in these reactions. The residual needle-like crystals constitute visual defects or imperfections observed on or around the etched polycide circuit pattern, and are often the cause of rejection of the pattern after visual inspection, contributing to substantial reduction of manufacturing yield. In addition, such crystals may lead to electrical short-circuits between adjacent polycide or other conductor regions in the pattern, as increased performance requirements result in closer spacing between such regions. A further imposition of closer spacing requirements results from the desire to reduce manufacturing costs by increasing the circuit density per unit area of pattern.

The formation of crystalline residues on or around the subtractively-etched polycide patterns is not discussed by Sze. Furthermore, there is no discussion by Sze or any other source of methods to ameliorate or suppress etching residues which have undesirable effects on increased circuit density design, visual inspection yield, or integrated circuit reliability.

SUMMARY OF THE INVENTION

A principal object of the present invention is to provide an improved method for the reactive subtractive etching of polycide layers by mixtures of sulfur hexafluoride and hydrogen bromide gases in the production of integrated circuits. It is another object of the invention to provide a method to minimize the formation of undesirable crystalline residues during the subtractive etching of polycide layers by plasma activation of mixtures of sulfur hexafluoride and hydrogen bromide gases.

In accordance with the objects of this invention an improved method of plasma-activated reactive subtractive etching of polycide layers by mixtures of sulfur hexafluoride and hydrogen bromide gases is achieved. After the subtractive etching of the polycide layer is performed, a purging operation of the reaction chamber by admission of a non-reactive gas such as nitrogen followed by evacuation results in the removal of water vapor and other residual species. This purging step inhibits the formation of needle-like crystals of residual compounds thought to form by chemical reaction between hydrogen bromide and water vapor and other species. Such needle-like crystals can be construed as defects in the etched polycide layer patterns, and their minimization results in increased manufacturing yields after visual inspection. Additionally, the reduced incidence of residual crystals is beneficial in helping to improve subsequent integrated circuit reliability.

BRIEF DESCRIPTION OF THE DRAWINGS

In the accompanying drawings forming a material part of this description, there is shown:

FIG. 1 is a cross-sectional schematic diagram of an etched polycide layer on an underlying substrate.

FIG. 2 is a process flow chart showing the process for subtractive reactive etching of polycide layers in the prior art.

DESCRIPTION OF THE PREFERRED EMBODIMENTS

Figure 3:
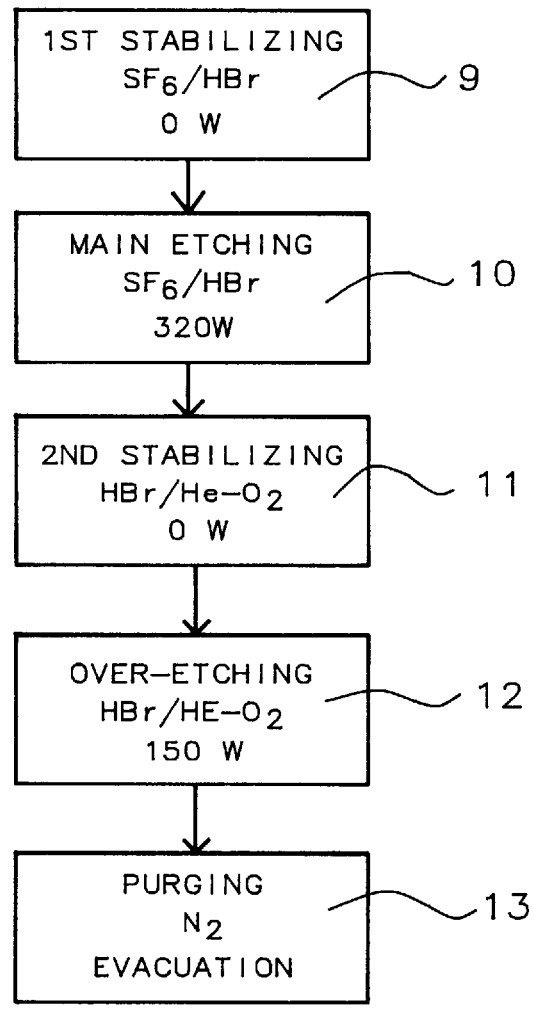
FIG. 3 is a process flow chart showing the process of the current invention for the subtractive reactive etching of polycide layers.

Referring now to FIG. 1, there is shown a schematic cross-sectional diagram of a pattern of polycide gates 1 formed by subtractive etching of a polycide layer on an underlying substrate 3 by plasma-activated mixtures of sulfur hexafluoride ($SF_6$) and hydrogen bromide (HBr) gases. The needle-like crystals of residual material 4 are believed to result from chemical reaction between EBr and water vapor and other residual species during or after the etching process.

The detailed process of reactive etching of polycide layers in mixtures of $SF_6$, HBr and $He/O_2$ employed in the prior art is seen by reference to FIG. 2 to consist of a stabilization step 5, a main etching step 6, a second stabilization step 7, and an over-etch step 8.

Referring now more particularly to FIG. 3, the improved process of the current invention will be described. In addition to stabilization steps 9 and 11 and etching steps 10 and 12 similar to the prior art, there is provided a purging step 13 employing introduction of a non-reactive gas and subsequent evacuation of the reaction chamber. A more complete description of the improved process is provided in Example 1, in which the detailed description of a typical polycide etching process run is given. In all steps, the gas pressure is given in milliTorr, gas flow rates in standard cubic centimeters per second (SCCM), RF power input in watts (W), magnetic field in gauss (G), time in seconds (sec), and termperature in degrees C.

EXAMPLE 1

---

1. First stabilization step:

Pressure 20 to 30 milliTorr
Flow rate SF6 45 to 50 SCCM, HBr 12 to 15 SCCM
Power 0 W
Magnetic field 30 to 60 G
Time 10 to 30 sec
Temperature 40 to 60 C.

2. Main etch step:

Pressure 20 to 30 milliTorr
Flow rate SF6 45 to 50 SCCM, HBr 12 to 15 SCCM
Power 300 to 350 W
Magnetic field 30 to 60 G
Time: to end point of etching
Temperature 40 to 60 C.

3. Second stabilization step:

Pressure 70 to 90 milliTorr
Flow rate HBr 40 to 50 SCCM, He/O2 2 to 5 SCCM
Power 0 W
Magnetic field 30 to 60 G
Time 10 to 30 sec
Temperature 40 to 60 C.

4. Over-etch step:

Pressure 70 to 90 milliTorr
Flow rate HBr 40 to 50 SCCM, He/O2 3 to 5 SC
Power 120 to 180 W
Magnetic field 30 to 60 G
Time 80 to 100 sec
Temperature 40 to 60 C.

5. Purge step:

Pressure: control by N2 flow
Flow rate N2 50 to 150 SCCM
Power 0 W
Magnetic field 30 to 60 G
Time 10 to 30 sec
Temperature 40 to 60 C.

6. Evacuation step:

Pump chamber 15 to 20 sec

---

The purge and evacuation steps described in the Example are sufficient to minimize the formation of residual compounds which are believed to result in the deposition of needle-like crystals on or about the etched polycide pattern. These steps are believed to be sufficient to remove water vapor and other residual species which are thought to react chemically with HBr to produce the solid crystalline residues.

It has been found that nitrogen (N2), a non-reactive gas under the conditions typically employed as described in Example 1, is particularly suitable as a common, inexpensive inert gas for the purge and evacuation steps of the current invention However, it will be understood that other non-reactive gases as, for example, helium (He), argon (Ar), or krypton (K), could be employed in place of N2 without any significant diminishment of the improvement brought about by the current invention.

While the invention has been particularly shown and described with reference to the preferred embodiments thereof, it will be understood by those skilled in the art that various changes in form and details may be made without departing from the spirit and scope of the invention.

What is claimed is:

1. A method of etching polycide layers on a semiconductor substrate comprising:
    introducing reactive gases into a reactor chamber in which said substrate is located;
    sustaining an electrical plasma therein by RF power input and a magnetic field;
    subtractively etching said polycide layers; and
    then purging said reactor chamber with a non-reactive gas, wherein the flow rate of the non-reactive gas is between about 50 and 150 sccm.

2. The method of claim 1 in which the reactive gases are sulfur hexafluoride, hydrogen bromide, and oxygen, and the non-reactive gases are nitrogen and helium.

3. The method of claim 1 wherein the etching is performed in two steps comprising:
    a main etching step at an RF power input of between about 300 to 350 W;
    an over-etching step at an RF power input of between about 120 to 180 W.

4. The method of claim 3 in which the main etching step is preceded by a first stabilization step and followed by a second stabilization step.

5. The method of claim 1 in which all steps are carried out in a magnetic field of between about 30 to 60 G.

6. A method of subtractive reactive etching of polycide layers on a semiconductor substrate by plasma activation of sulfur hexafluoride and hydrogen bromide gas mixtures with RF power in a magnetic field, comprising:
    a first stabilizing step in sulfur hexafluoride and hydrogen bromide gas mixtures at 0 W RF power for between about 10 to 30 sec;
    a main etching step in sulfur hexafluoride and hydrogen bromide gas mixtures at between about 300 to 350 W RF power until the desired end point of etching;
    a second stabilizing step in hydrogen bromide and oxygen and helium gas mixtures at 0 W RF power for between about 10 to 30 sec;
    an over-etching step in hydrogen bromide and oxygen and helium gas mixtures at between about 120 to 180 W RF power for between about 80 to 100 sec;
    a purge step in nitrogen gas for between about 10 to 30 sec, wherein the flow rate of the nitrogen gas is between about 50 and 150 sccm; and
    an evacuation step of pumping out nitrogen and residual gases for between about 10 to 30 sec. to a final pressure below 1 milliTorr.

7. The method of claim 6 in which the flow rates of gas mixtures are:
    sulfur hexafluoride and hydrogen bromide between about 45–50 and 12–15 SCCM respectively;
    hydrogen bromide and an oxygen and helium gas mixture between about 40–50 and 2–5 SCCM, respectively.

8. The method of claim 6 in which the magnetic field is between about 30 to 60 G and the temperature is between about 40° to 60° C.

9. The method of claim 6 in which the total gas pressure is between about 20 to 30 milliTorr for the first stabilization and main etching steps, and between about 70 to 90 milliTorr for the second stabilization and over-etching steps.

10. The method of claim 6 in which the nitrogen gas flow rate is between about 50 and 100 SCCM.

11. A method of subtractive etching of polycide layers formed on a semiconductor substrate by reactive etching in a plasma-activated gas mixture comprising:
    a stabilizing step at a total gas pressure of between about 20 to 30 milliTorr at a sulfur hexafluoride flow rate of between about 45 to 50 SCCM; and hydrogen bromide flow rate of between 12 and 15 SCCM at 0 W RF power for between about 10 to 30 sec.;

a main etching step at a total gas pressure of between about 20 to 30 milliTorr at a sulfur hexafluoride flow rate of between about 45 to 50 SCCM and a hydrogen bromide flow rate of between about 12 to 15 SCCM at between about 300 to 350 W RF power to desired end point of etching;

a second stabilization step at a total gas pressure of between about 70 to 90 milliTorr at a hydrogen bromide flow rate of between about 40 to 50 SCCM; and an oxygen and helium gas mixture flow rate of between about 2 to 5 SCCM at 0 RF power for between about 10 to 30 sec.;

an over-etching step at a total gas pressure of between about 70 to 90 milliTorr at a hydrogen bromide flow rate of between about 40 to 50 SCCM and an oxygen and helium gas mixture flow rate of between about 2 to 5 SCCM at between about 120 to 180 W RF power for between about 80 to 100 sec.;

a purge step at a nitrogen flow rate of between about 50 to 150 SCCM at 0 W RF power for between about 10 to 30 sec.;

an evacuation step pumping out nitrogen and residual gases for between about 10 to 30 sec. to a final total gas pressure below 1 milliTorr.

12. The method of claim 11 in which all steps are carried out at a temperature of between about 40° to 60° C.

13. The method of claim 11 in which all steps are carried out in a magnetic field of between about 30 to 60 G.

14. A method of subtractive etching of polycide layers with minimal formation of residual condensate needle-like crystals, comprising:

reactive etching of polycide with plasma-activated mixtures of sulfur hexafluoride, hydrogen bromide, and oxygen and helium gases;

then purging the reaction chamber with nitrogen gas, wherein the flow rate of the nitrogen gas is between about 50 and 150 sccm; and subsequent evacuation of said reaction chamber.

15. The method of claim 14 in which the plasma activation is sustained by RF power input and a magnetic field of between about 30 to 60 G.

16. The method of claim 15 in which the temperature ranges between about 40° to 60° C.

17. The method of claim 16 further comprising the steps of;

stabilizing in a sulfur hexafluoride and hydrogen bromide gas mixture at 0 W RF power;

etching in a sulfur hexafluoride and hydrogen bromide gas mixture at flow rates of between about 45–50 and 12–15 SCCM respectively;

stabilizing in a hydrogen bromide and an oxygen and helium gas mixture at 0 W RF power;

etching in a hydrogen bromide and an oxygen and helium gas mixture at flow rates of between about 40–50 and 2–5 SCCM, respectively.

18. The method of claim 17 wherein:

said stabilizing step in a sulfur hexafluoride and hydrogen bromide gas mixture is at a total gas pressure of between about 20 to 30 milliTorr at a sulfur hexafluoride flow rate of between about 45 to 50 SCCM and a hydrogen bromide flow rate of between about 12 and 15 SCCM at 0 W RF power for between about 10 to 30 sec.;

said etching step in sulfur hexafluoride and hydrogen bromide is at a total gas pressure of between about 20 to 30 milliTorr and a hydrogen bromide flow rate of between about 12 to 15 SCCM at a RF power input of between about 300 to 350 W to desired etch end point;

said stabilizing step in a hydrogen bromide and an oxygen and helium gas mixture is at a total gas pressure of between about 70 to 90 milliTorr at a hydrogen bromide flow rate of between about 40 to 50 SCCM and an oxygen and helium gas mixture flow rate of between about 2 to 5 SCCM at 0 W RF power for between about 10 to 30 sec.;

said etching step in a hydrogen bromide and an oxygen and helium gas mixture is at a total gas pressure of between about 70 to 90 milliTorr at a hydrogen bromide flow rate of between about 40 to 50 SCCM and an oxygen and helium gas mixture flow rate of between about 2 to 5 SCCM at between about 120 to 180 W RF power for between about 80 to 100 sec.;

a purge step at a nitrogen gas flow rate of between about 50 to 150 SCCM at 0 W RF power for between 10 to 30 sec.;

an evacuation step pumping out nitrogen and residual gases for between about 10 to 30 sec. to a final total pressure below 1 milliTorr.

* * * * *